(12) United States Patent
Nemati et al.

(10) Patent No.: US 7,304,327 B1
(45) Date of Patent: Dec. 4, 2007

(54) THYRISTOR CIRCUIT AND APPROACH FOR TEMPERATURE STABILITY

(75) Inventors: Farid Nemati, Menlo Park, CA (US); Kailash Gopalakrishnan, Stanford, CA (US); Andrew E. Horch, Sunnyvale, CA (US)

(73) Assignee: T-RAM Semiconductor, Inc., Milpitas, CA (US)

( * ) Notice: Subject to any disclaimer, the term of this patent is extended or adjusted under 35 U.S.C. 154(b) by 471 days.

(21) Appl. No.: 10/706,162

(22) Filed: Nov. 12, 2003

(51) Int. Cl.
*H01L 29/745* (2006.01)
(52) U.S. Cl. .................. 257/162; 365/180; 365/212
(58) Field of Classification Search ................ 257/153, 257/156, 162; 365/180, 212
See application file for complete search history.

(56) References Cited

U.S. PATENT DOCUMENTS

| | | | |
|---|---|---|---|
| 2,902,674 A * | 9/1959 | Billings et al. | 365/181 |
| 4,143,421 A * | 3/1979 | Tonnel et al. | 365/180 |
| 6,229,161 B1 | 5/2001 | Nemati et al. | |
| 6,462,359 B1 * | 10/2002 | Nemati et al. | 257/107 |
| 6,608,790 B2 * | 8/2003 | Tran et al. | 365/211 |
| 6,703,646 B1 | 3/2004 | Nemati et al. | |
| 6,756,612 B1 | 6/2004 | Nemati et al. | |
| 6,777,271 B1 | 8/2004 | Robins et al. | |
| 6,818,482 B1 | 11/2004 | Horch et al. | |
| 6,828,176 B1 | 12/2004 | Nemati et al. | |

OTHER PUBLICATIONS

Nemati et al, "A Novel Thyristor-based SRAM . . . Memories", IEDM 1999 pp. 283-286.*

* cited by examiner

*Primary Examiner*—Jerome Jackson

(57) ABSTRACT

Switching operations, such as those used in memory devices, are enhanced using a semiconductor device having a thyristor adapted to switch between conducting and blocking states and operate at low power. According to an example embodiment of the present invention, thyristor characteristics are managed over a broad temperature range using a control circuit for coupling a signal, such as a DC voltage signal, to a portion of a thyristor for controlling temperature-related operation thereof, e.g., for controlling bipolar gains. In one implementation, a control port adaptively adjusts a signal coupled to the thyristor as a function of temperature, such that at relatively low temperatures unwanted increases in holding current ($I_H$) are prevented. In another implementation, the control port couples the signal at relatively high temperature operation for controlling the forward blocking voltage ($V_{FB}$) in such a manner that a blocking state of the thyristor is held. In still another implementation, a circuit controller is adapted for applying the signal to the thyristor via the control port as a function of temperature by monitoring operation of a reference thyristor. With these approaches, thyristor operation can be maintained in a relatively stable manner over a broad temperature range.

17 Claims, 11 Drawing Sheets

THYRISTOR CIRCUIT AND APPROACH FOR TEMPERATURE STABILITY

FIELD OF THE INVENTION

The present invention is directed to semiconductor devices and, more specifically, to semiconductor devices including thyristor devices that are susceptible to operational changes due to temperature.

BACKGROUND

Recent technological advances in the semiconductor industry have permitted dramatic increases in integrated circuit density and complexity, and equally dramatic decreases in power consumption and package sizes. Presently, single-die microprocessors are being manufactured with many millions of transistors, operating at speeds of hundreds of millions of instructions per second and being packaged in relatively small, air-cooled semiconductor device packages. The improvements in such devices have led to a dramatic increase in their use in a variety of applications. As the use of these devices has become more prevalent, the demand for reliable and affordable semiconductor devices has also increased. Accordingly, the need to manufacture such devices in an efficient and reliable manner has become increasingly important.

An important part in the design, construction, and manufacture of semiconductor devices concerns semiconductor memory and other current-switching circuitry. Conventional random access memory devices include a variety of circuits, such as SRAM and DRAM circuits. The construction and formation of such memory circuitry typically involves forming at least one storage element and circuitry designed to access the stored information. DRAM is very common due to its high density (e.g., high density has benefits including low price), with DRAM cell size being typically between 6 $F^2$ and 8 $F^2$, where F is the minimum feature size. However, with typical DRAM access times of approximately 50 nSec, DRAM is relatively slow compared to typical microprocessor speeds and requires refresh. SRAM is another common semiconductor memory that is much faster than DRAM and, in some instances, is of an order of magnitude faster than DRAM. Also, unlike DRAM, SRAM does not require refresh. SRAM cells are typically constructed using 4 transistors and 2 resistors or 6 transistors, which result in much lower density and is typically between about 60 $F^2$ and 100 $F^2$.

Various SRAM cell designs based on a NDR (Negative Differential Resistance) construction have been introduced, ranging from a simple bipolar transistor to complicated quantum-effect devices. These cell designs usually consist of at least two active elements, including an NDR device. In view of size considerations, the construction of the NDR device is important to the overall performance of this type of SRAM cell. One advantage of the NDR-based cell is the potential of having a cell area smaller than four-transistor and six-transistor SRAM cells because of the smaller number of active devices and interconnections.

Concerns with NDR-type circuits and memory include, among others: high standby power consumption due to the large current needed in one or both of the stable states of the cell; requiring excessively high or excessively low voltage levels for cell operation; stable states that are too sensitive to manufacturing variations and provide poor noise-margins; limitations in access speed due to slow switching from one state to the other; limitations in operability due to temperature, noise, voltage and/or light stability; and manufacturability and yield issues due to complicated fabrication processing.

A thin capacitively-coupled thyristor-type NDR device can be effective in overcoming many previously unresolved problems for a variety of semiconductor applications, such as memory applications. An important consideration in the design of a thin capacitively-coupled thyristor involves designing the body of the thyristor sufficiently thin, such that capacitive coupling between a control port and a base region of the thyristor can substantially modulate the potential of the base region. Another important consideration for thin capacitively coupled thyristors involves temperature-related operating effects thereof, such as temperature-related effects upon current passing and blocking states. For instance, in order to maintain a current passing state, thin capacitively-coupled thyristors require that a minimum holding current ($I_H$) pass through the thyristor. The minimum $I_H$, however, is temperature dependent as a result of temperature-related fluctuation of bipolar gains of the thyristor. Specifically, the $I_H$ required to maintain a current passing state of a thin capacitively-coupled thyristor tends to increase as the temperature decreases. Increases in $I_H$ are undesirable due to a corresponding increase in standby power required to maintain the current passing state of the thyristor. As another example, the forward blocking voltage of a thyristor tends to decrease at higher temperature. Decrease in forward blocking voltage is undesirable as it degrades the ability of the thyristor to maintain the current blocking state at higher temperatures.

These and other considerations have presented challenges to the implementation of such a thin capacitively-coupled thyristor, and in particular with applications susceptible to temperature fluctuations.

SUMMARY

The present invention is directed to semiconductor devices that address the above-mentioned challenges. The present invention is exemplified in a number of implementations and applications, some of which are summarized below.

According to an example embodiment of the present invention, the holding current ($I_H$) for a thyristor is modulated using a signal applied to a base region of the thyristor using a control circuit. The control circuit includes a node adjacent to the base region and adapted to apply a voltage that is responsive to temperature-related changes detected in thyristor current passing and/or current blocking state, for instance, using a feedback loop. In one implementation, the control circuit applies a voltage bias that biases a portion of the thyristor in a manner that reduces holding current in the thyristor during relatively low temperature operation, and alters, changes polarity or otherwise removes the voltage bias in a manner that increases the forward blocking voltage at relatively higher temperature operation.

According to another example embodiment of the present invention, a semiconductor device includes a thyristor with immediately adjacent base regions and with first and second control ports adapted to respectively capacitively couple to the immediately adjacent base regions. The first control port is arranged to capacitively couple a first signal to a first one of the base regions for controlling current flow in the thyristor. The second control port is arranged to adjustably modulate the carrier concentration at least near the surface of the second base region using, for example, an adjustable DC voltage applied to the second control port, and thereby to control the bipolar current gain of the thyristor. With this approach, behavior of the thyristor that is related to bipolar gains therein can be controlled at a variety of temperatures. For instance, at relatively low temperatures, the bipolar gain of the thyristor is increased via the second control port to reduce the minimum holding current ($I_H$) for the thyristor. At relatively high temperatures, the bipolar gain of the thyristor is either left unchanged and/or decreased by selecting the second control port to achieve a desirable forward blocking voltage for the thyristor.

According to another example embodiment of the present invention, a control circuit is adapted for applying a signal (e.g., a DC voltage) to a thyristor for controlling bipolar gains therein. For instance, when implemented with the semiconductor device discussed in the preceding paragraph, the control circuit is adapted to apply a signal to the second control port as a function of temperature. In one implementation, the control circuit applies a DC voltage that decreases (e.g., becomes negative) with decreasing temperature and increases (e.g., becomes positive) with increasing temperature. With this approach, bipolar gains in a thyristor device are controlled for managing $I_H$ and forward blocking voltage as discussed above.

According to another example embodiment of the present invention, the control circuit includes a reference thyristor, the operation of which is used to detect temperature-responsiveness of other thyristor devices in the semiconductor device. In one example, the reference thyristor is arranged such that it is slightly more susceptible to temperature-related failure than other thyristors in the semiconductor device. Using a detected failure of data retention in the reference thyristor, a bias voltage is selectively applied to thyristors in the semiconductor device to avoid similar failures as the operational temperature varies.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention in connection with the accompanying drawings, in which.

DETAILED DESCRIPTION

Figure 1A:
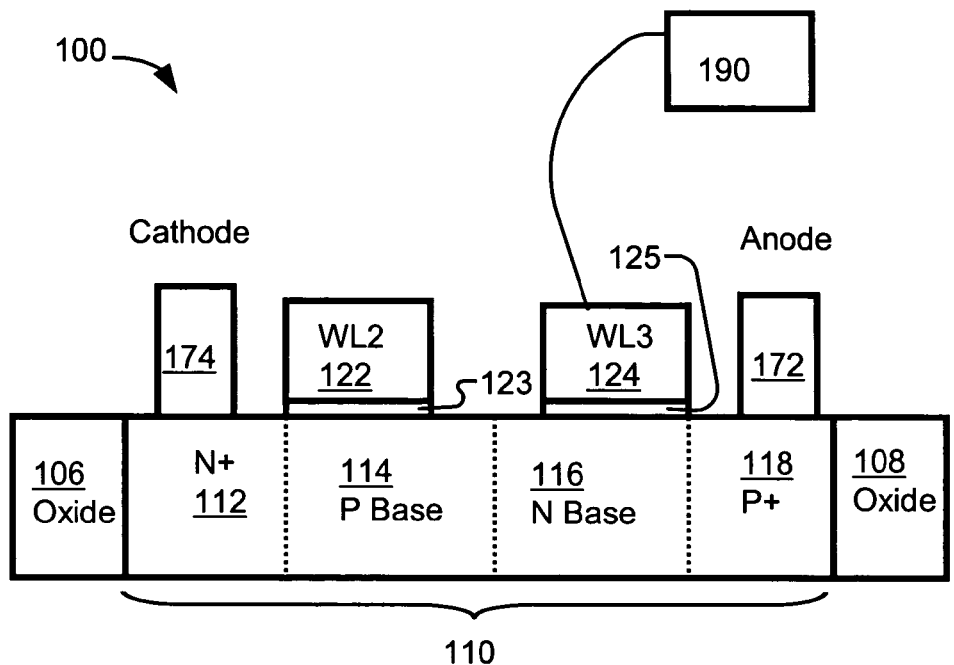
FIG. 1A is a cross-section of a thyristor-based device having thyristor with a second control port adapted to manage holding current and forward blocking voltage for the thyristor with temperature, according to an example embodiment of the present invention.

The present invention is believed to be applicable to a variety of different types of semiconductor devices, and has been found to be particularly suited for devices using thyristors, such as memory cells and other current-switching circuits. While the present invention is not necessarily limited to such devices, various aspects of the invention may be appreciated through a discussion of various examples using this context.

According to an example embodiment of the present invention, a control circuit is adapted for coupling a voltage to a thyristor body for mitigating temperature-responsive changes in the conductance state of the thyristor body. The voltage is selectively applied to the thyristor body, for example, using a DC voltage source coupled to a control port and adapted for applying the voltage as a function of temperature.

According to another example embodiment of the present invention, a semiconductor device includes a control port adapted and operated for coupling a signal (e.g., a DC voltage signal) to a thyristor body for controlling bipolar gains therein. The thyristor body includes contiguous regions of opposite polarity, including a P+ anode emitter region adjacent to an N-base region, and an N+ cathode emitter region adjacent to a P-base region, with the N-base and P-base regions adjacent to one another. The contiguous thyristor regions form bipolar transistors comprising an npn bipolar transistor (the N+ emitter region and N-base region separated by the P-base region) and a pnp bipolar transistor (the P+ emitter region and P-base region separated by the N-base region).

In one implementation, the signal at the control port is selectively coupled to the thyristor body during relatively low temperature operation and is used to increase the bipolar gain of one of the bipolar transistors. For example, the gain of the pnp bipolar transistor can be increased by coupling the signal to the P+ emitter region and to the adjacent N-base region. When the signal at the control port is adaptively applied at low temperatures, low-temperature-related effects that tend to increase the holding current ($I_H$) of the thyristor are compensated for with the corresponding effects of the increased bipolar gains, which tend to lower $I_H$. With this approach, adaptive control of $I_H$ in the thyristor can be effected and used to reduce power consumption while maintaining selected operating characteristics for the thyristor. Furthermore, the adaptive application of the signal (and corresponding bipolar gain increase) during low temperature operation allows the thyristor to operate under normal conditions at relatively higher temperatures. This is useful because, as discussed above, increased bipolar gains at high temperatures would tend to undesirably reduce the forward blocking voltage ($V_{FB}$) of the thyristor.

In a more particular implementation, the signal applied to the control port includes a DC voltage that is selected as a function of temperature. At relatively low temperatures, the voltage is selected to increase depletion regions in an underlying base region and thereby reduce the base carrier concentration and/or width and increase the bipolar gain, which decreases $I_H$. At high temperatures, where this temperature compensation effect is no longer needed, the selected voltage does not deplete carriers in the base region, and in one instance, the selected voltage increases carrier concentration in the underlying base region. In one instance, when the underlying base region is an N base region, a negative voltage is applied to deplete a portion of the N base at low temperatures, with the voltage being removed or a positive voltage being applied at higher temperatures. In another instance, when the underlying base region is a P base region, a positive voltage is applied to deplete the P base at low temperatures, with the positive voltage being removed or a negative voltage being applied at higher temperatures. By applying a voltage on the control port as a function of temperature, a low $I_H$ at low temperatures and a high $V_{FB}$ at higher temperatures can be achieved, both of which are desirable in thyristor implementations, including thin capacitively-coupled thyristor implementations.

In another implementation, the semiconductor device discussed above is arranged to exhibit reduced bipolar gains of the npn or pnp bipolar transistors therein, and the control port is arranged to apply a selected signal to the thyristor that counters reduced bipolar gains during low temperature operation. For instance, a carrier lifetime reduction mechanism can be implemented in connection with the thyristor to reduce bipolar gains of the thyristor. In connection with such a carrier lifetime reduction mechanism, the voltage applied to the control port of the thyristor is selected to counter effects of the carrier lifetime reduction mechanism at low temperatures by increasing the bipolar gains in the thyristor. With this approach, benefits of carrier lifetime reduction mechanisms (i.e., faster switching between conductance states), as well as benefits of other mechanisms and thyristor arrangements that exhibit reduced bipolar gains, can be realized while maintaining a desirable $I_H$. For general information regarding semiconductor device implementations, and for specific information regarding carrier reduction mechanisms to which the present invention may be applicable, reference may be made to U.S. patent application Ser. No. 10/282,331 (TRAM.033PA), filed on Oct. 28, 2002 and entitled "Carrier Coupler for Thyristor-based Semiconductor Device," which is fully incorporated herein by reference).

FIG. 1A shows a semiconductor device 100 adapted for bipolar gain control, according to another example embodiment of the present invention. The device 100 includes a thyristor 110 having contiguous regions of opposite polarity including a P base region 114 and an N base region 116 coupled to one another and, respectively to N+ cathode and P+ anode emitter regions 112 and 118, thus forming a PNPN thyristor structure. The PNPN structure effectively includes two bipolar transistors: an npn bipolar transistor (the N+ emitter region 112 and N base region 116 separated by the P base region 114) and a pnp bipolar transistor (the P+ emitter region and P base region separated by the N base region). Oxide spacer regions 106 and 108 insulate the thyristor from adjacent circuitry. A first control port 122 is adapted for capacitively coupling to the P baser region 114, using dielectric material 123, for enhancing the switching speed of the thyristor 110 between current passing and current blocking states. A second control port 124 is disposed on a dielectric material 125 and over both the N base region 116 and the P+ emitter region 118, separated therefrom by a dielectric 125. Contacts 172 and 174 are made to the P+ and N+ emitter regions 118 and 112, respectively.

According to one aspect of the present invention, during a forward-blocking state for the above thyristor structure, temperature-based feedback is applied with a circuit controller 190 to control the thyristor by altering its effective current gain ("β") of the PNP device. In its forward-blocking state, the junction ("J2") at the intersection of the thyristor base regions 114 and 116 is reversed biased while the other two junctions ("J1" and "J3") are forward biased, with the N+ cathode to P-base junction being J3 and the P+ anode to N-Base junction being J1. With the depletion region at J2 being much wider than the depletion regions at J1 and J3 in the forward-blocking state, most of the voltage drop is across J2.

The circuit controller 190 is coupled to the control port 124 and adapted to apply a voltage thereto as a function of temperature. During low temperature operation, the voltage applied to the second control port 124 by the circuit controller 190 is selectively applied to increase the gain of the PNP device discussed in the above paragraph. This increase in gain correspondingly decreases the $I_H$ necessary to maintain the state of the thyristor 110. In one instance, the circuit controller 190 is adapted to apply a negative DC voltage to the second control port 124 during low temperature operation to increase the injection of carriers form the P+ emitter region 118 to the N base region 116. This injection of carriers may be implemented, for example, by reducing the carrier concentration in and/or the effective width of the N base region 116 with the voltage applied to the second control port 124. In one implementation, the increase in gain is effected without inverting a portion of the N base region 116 (i.e., without forming a MOS inversion channel), and in another implementation, a portion of the N base region 116 is inverted. Further example discussion regarding carrier injection into the N base region 116, as well as N base width and carrier depletion, is below in connection with other figures.

At high temperature operation, the voltage applied to the second control port 124 by the circuit controller 190 is coupled to the underlying portions of the thyristor 110 and increases the base carrier concentration and/or width and/or the non-ideal (i.e., J1 leakage) component of emitter current in the thyristor. Consequently, the bipolar gain of the thyristor 110 is decreased and the forward blocking voltage ($V_{FB}$) of the thyristor is increased. In this regard, the voltage at the control port is selectively applied during relatively high temperature operation and is used to reduce the bipolar gain of the PNP device.

Figure 1B:
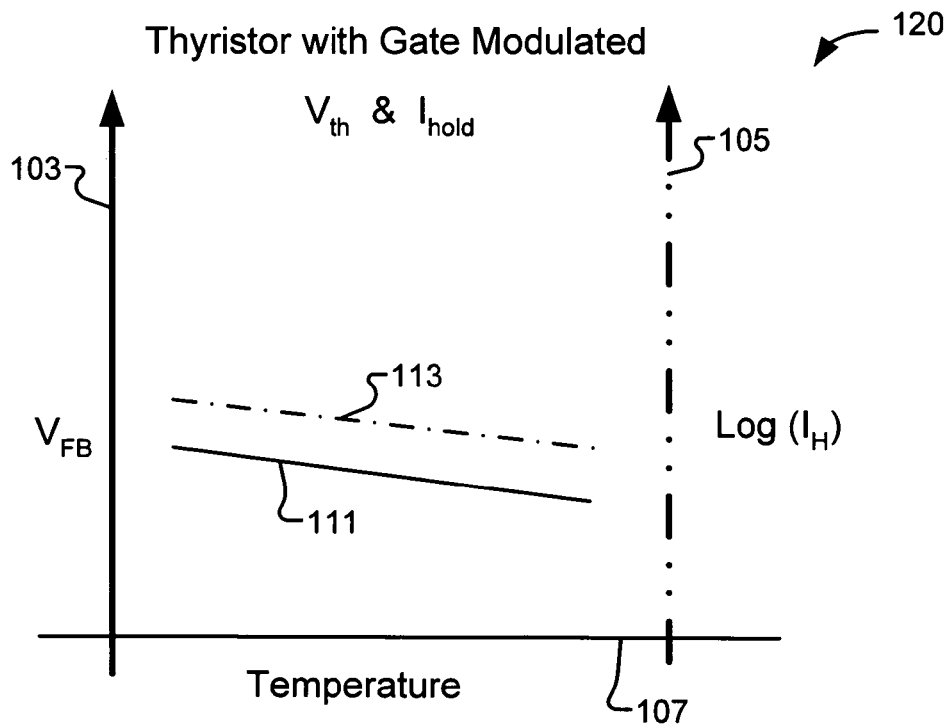
FIG. 1B is a graph depicting blocking voltage ($V_{FB}$) versus holding current ($I_H$) for one particular implementation of the semiconductor device shown in FIG. 1A.

As discussed above, high $V_{FB}$ (relative to the expected operating conditions of the thyristor) and low $I_H$ are both desirable in a variety of typical thyristor implementations. In this regard, FIG. 1B shows an example graph 120 of the operation of the device 100 shown in FIG. 1A, with relatively stable $V_{FB}$ and $I_H$ over a wide temperature range. The graph 120 shows temperature on the horizontal axis 107 and both $V_{FB}$ and Log ($I_H$) on vertical axes 103 and 105, respectively. Curves 111 and 113 respectively show the temperature response of $V_{FB}$ and Log ($I_H$) for the device 100 being operated using the circuit controller 190 to selectively apply a voltage to the gate 124 during high temperature operation. As shown in FIG. 1B, predictable $V_{FB}$ and $I_H$ characteristics for a thyristor can be maintained over a relatively wide temperature range, which is particularly useful for implementing the thyristor in applications subjected to variations in temperature.

Figure 2A:
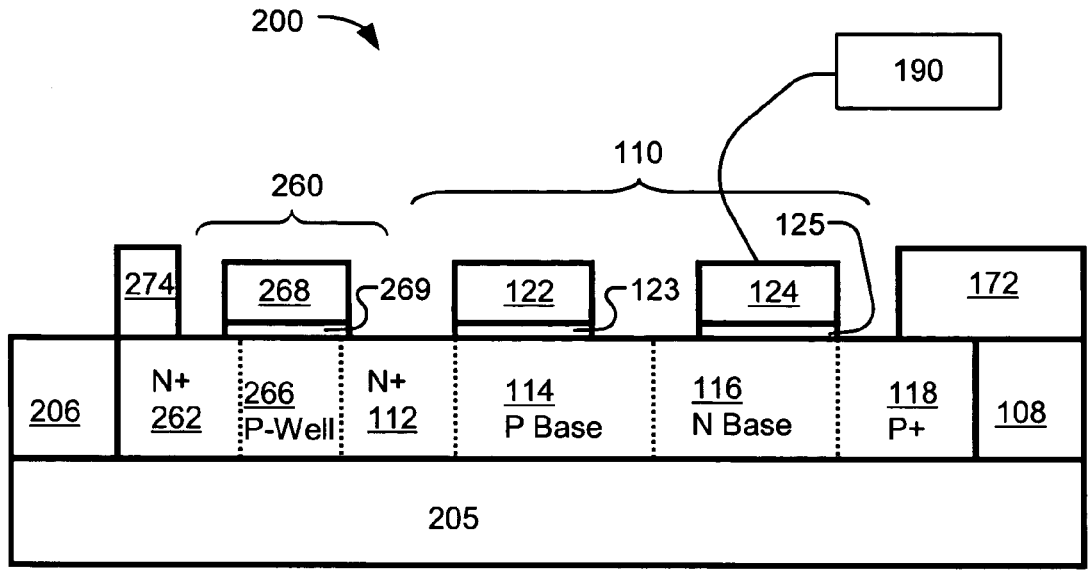
FIG. 2A is a cross-section of a thyristor-based memory cell having a thyristor with a second control port adapted to manage holding current and forward blocking voltage for the thyristor with temperature, according to another example embodiment of the present invention.

FIG. 2A is a memory cell 200 with the thyristor 110 of FIG. 1A coupled to a pass device 260, both of which are on an insulator layer 205 in a silicon-on-insulator (SOI) structure, according to another example embodiment of the present invention. The pass device (i.e., a transistor) includes N+ source/drain regions 262 and 112 separated by a P channel region 266. A control port (i.e., transistor gate) 268 is separated from the channel region by a dielectric 269 and adapted for applying a voltage for conducting current between the N+ source/drain regions 262 and 112. A bit line contact 274 is coupled to the N+ source/drain region 262 and, when the pass device 260 is in the conducting state, to the N+ emitter region 112 of the thyristor 110. An insulative spacer 206 insulates the N+ source/drain region 262 from other circuitry. The thyristor 110 is operable as discussed above in connection with FIG. 1A, with the pass device 260 controlling the coupling of the N+ emitter region 112 to the bit line 274, with data being stored at the N+ emitter region as a function of the thyristor's conductance state. An P+ anode contact 172 is also shown.

Figure 2B:
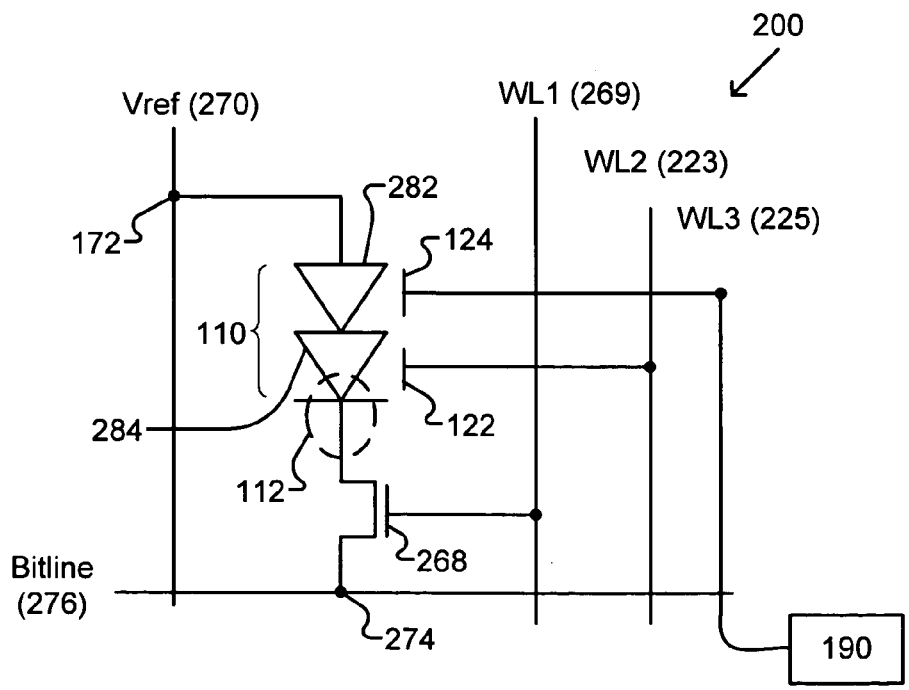
FIG. 2B is a circuit diagram in which the memory cell shown in FIG. 2A may be implemented, according to another example embodiment of the present invention.

FIG. 2B is a memory circuit 200 having a control port 124 adapted for controlling bipolar gains in a thyristor 110 (e.g., of FIG. 2A), for example as discussed above, according to another example embodiment of the present invention. The circuit arrangement 200 includes the thyristor 110, having a body region with anode and cathode end portions 282 and 284 (which may be interchanged, depending upon the implementation), and a first capacitively-coupled control port 122 adapted for controlling current flow in the thyristor. The anode end portion 282 of the thyristor 110 is coupled to a reference voltage (Vref) line 270. The cathode end portion 284 is coupled to a pass device 260, implemented here as a MOSFET having a gate 268 adapted for controlling current flow therein. The pass device 260 is coupled to a bit line 276 and, when the gate 268 is controlled for switching the pass device into a conducting state, the bit line is electrically coupled to the cathode emitter end portion 284 of the thyristor 110. In addition, first, second and third word lines 269, 223 and 225 are respectively coupled to the gate 268, first control port 122 and second control port 124 (e.g., the gate and/or the control ports form part of the respective word lines). For general information regarding thyristor and current-switching implementations, and for specific information regarding thyristor current control that may be implemented in connection with the present invention, reference may be made to U.S. Pat. No. 6,229,161 (Nemati, et al.), which is fully incorporated herein by reference.

The second control port 124 is adapted for coupling a voltage to the anode emitter end portion 282 for controlling bipolar gains in the thyristor 110, such as described above. A circuit controller 190 is coupled to the second control port 124 and adapted for applying the voltage thereto as a function of temperature. At relatively high temperature applications, the circuit controller 190 increases the voltage applied to the second control port 124, thereby effecting the bipolar gain in a portion 217 of the anode end portion 282. At relatively lower temperature applications, the circuit controller 190 reduces or removes the voltage applied to the second control port 124. By controlling the voltage applied to the control port 124 with the circuit controller 190, a high $V_{FB}$ is achieved at high temperatures, and a low $I_H$ is achieved at low temperatures.

Generally, as described in the above-mentioned U.S. Pat. No. 6,229,161, typical operation of the memory circuit 200 in FIG. 2B involves using an access controller to provide appropriate control over the bit line 276, gate 268, control port 122 and, in one implementation, second control port 124. For example, in standby mode, the bit line 276, word lines 269 and 223 are inactive or at a low voltage level (which can be different for each line). For a write "Zero" operation, bit line 276 is raised to its high level and gate 268 becomes active. This charges the level at the cathode emitter region 112 to a high voltage level and moves the thyristor 110 out of the strong forward biased region. A pulse is then applied to thyristor control port 122. Capacitive coupling from the thyristor control port 122 to the adjacent P base region 114 results in an outflow of the minority charges from the middle P-doped region 114 on the falling edge of the pulse applied to the thyristor control port 122 and blocks current passing in the thyristor 110. The thyristor 110 is sufficiently thin so that the thyristor control port 122 has tight control on the potential across the body of the thyristor (e.g., across the P base region 214), and can modulate this potential via the capacitive coupling. The thyristor 110 is switched to the blocking state after this operation, wherein the control port 124 couples a voltage to the N base region 116 and P+ emitter region 118 for maintaining the blocking state at relatively high temperatures, as discussed above.

For a write "One" operation, the voltage level of the bit line 276 is held low. After the gate 268 is raised to its high level, a pulse is applied to the thyristor control port 122. The rising edge of this pulse raises the potential of the P base region 114 via capacitive coupling and makes the PN and NP junctions forward biased which, in-turn, starts the well-known regenerative process in the PNPN thyristor construction and the thyristor 110 transitions to its forward conducting state. After completing such an operation, control over the bit line 276 and word lines 269 and 223 typically changes to effect the standby mode in which a current path through the pass device 260 is blocked.

Various ones of the example embodiments described below in connection with the figures share similar features with each other and with FIGS. 2A and 2B, as discussed above. In each of these figures, certain discussion of similar features with similarly labeled articles is omitted for brevity.

Figure 2C:
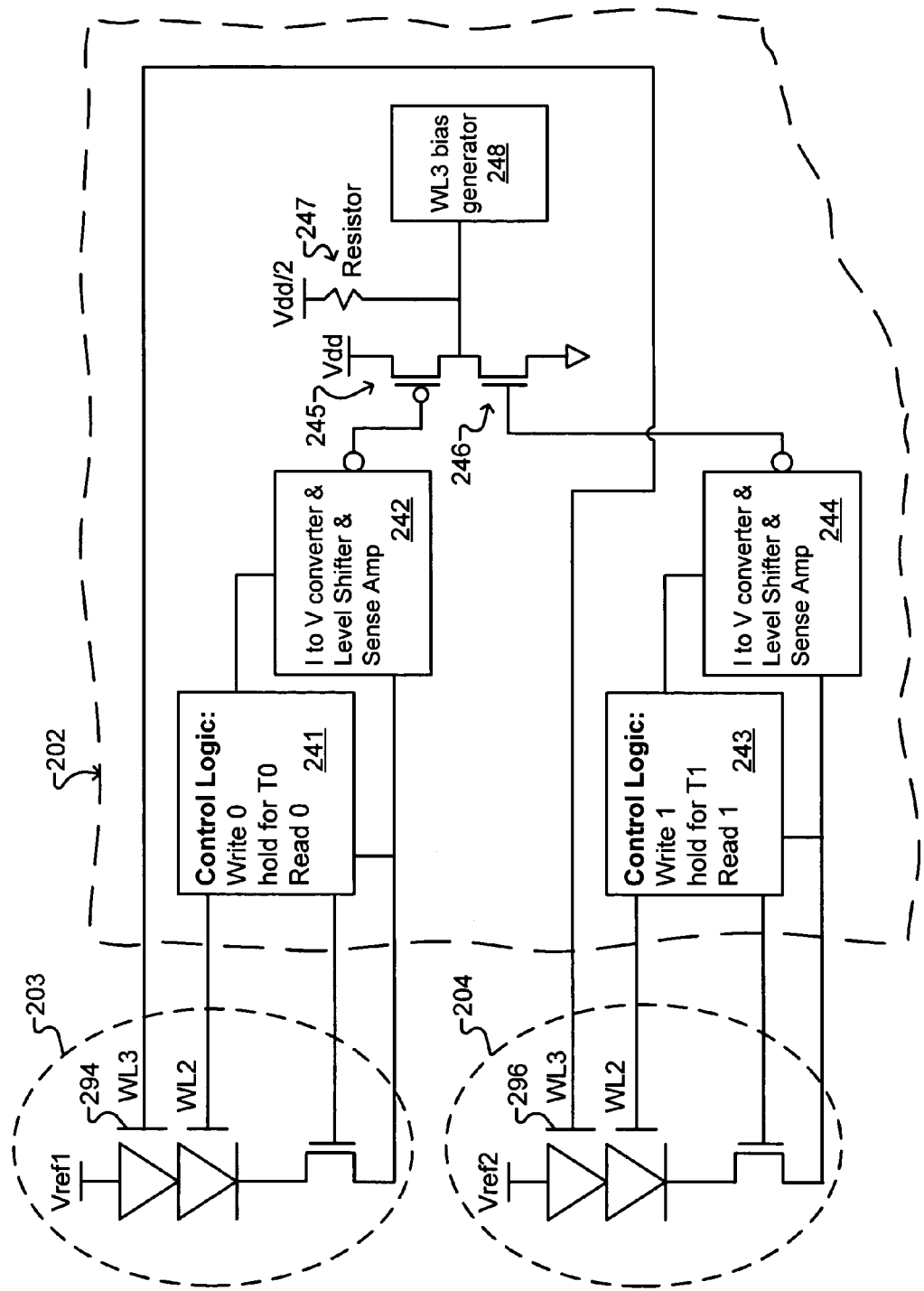
FIG. 2C is a control circuit adapted for providing a temperature-related signal to a thyristor control port for selectively controlling bipolar gains, according to another example embodiment of the present invention.

FIG. 2C shows a memory circuit 201 having a control circuit 202 that may, for example, be implemented in connection with circuit controller 190 of FIGS. 2A and 2B, according to another example embodiment of the present invention. In this implementation, two memory cells 203 and 204 are monitored using the control circuit 202, with characteristics of the two memory cells used for generating temperature-responsive control signals with the control circuit 202. The various elements in each of memory cells 203 and 204 correspond to similar elements (i.e., control ports, pass devices) shown in FIG. 2A, with reference numerals to these similar elements being omitted for brevity. In one implementation, the memory cells 203 and 204 are control cells arranged for providing temperature-responsive feedback to the control circuit 202 for use in controlling functional cells (e.g., cells used to store data) and may, for example, be included in the control circuit. In another implementation, the memory cells 203 and 204 are active cells used to store data, with the control circuit 202 adapted for maintaining temperature stability in memory cells 203, 204 and/or other cells in an array of such cells.

In one implementation, memory cells 203 and 204 are respectively used to verify that the control port 294 is correctly biased to prevent a data "zero" retention problem and that the control port 296 is biased correctly to prevent a data "one" retention problem. Each of the data "one" and data "zero" retention at respective memory cells is related to a conductance state of the thyristor in each memory cell, for instance, as discussed in connection with FIG. 3 below. The control circuit 202 tests cells including memory cells 203 and 204, with cells having data "zero" being checked every T0 seconds and cells with data "one" being checked every T1 seconds to detect if a fail condition has occurred. For instance, control logic 241 writes a "zero" into cell 203, holds for T0 seconds and then reads cell 203 to see if the "zero" data has held. Similarly, control logic 243 writes "one" into cell 204, holds for T1 seconds and then reads cell 204 to see if the "one" data has held.

If a cell has failed, the voltage applied to its second control port (WL3) (of the cells 203 and 204 shown, or, for instance, of other functional cells, is adjusted depending on whether it was a data "zero" or a data "one" failure. For a data "zero" failure, current-to-voltage converter 242 and gate 245 are used in connection with resistor circuit 247 and WL3 bias generator 248 to bias WL3 294. For a data "one" failure, current-to-voltage converter 244 and gate 246 are used in connection with resistor circuit 247 and WL3 bias generator 248 to bias the second thyristor control port WL3 296. The control circuit 202 continuously (e.g., about every T0 & T1 seconds) checks the cells 203 and 204, and the voltage applied to the second thyristor control port (WL3) for each cell is adjusted in response to temperature changes.

In another implementation, the memory cell 203 is part of an array, is initially written with a data "zero" and is either modified or biased so it will fail data "zero" before other cells in the array fail. In one instance, the Vref voltage applied to memory cell 203 is increased to a larger value than that used for other cells in the array. The cell 203 is read (e.g., using a sense amplifier and other circuitry) after some period of time (T0). If the cell is on it will cause the signal from the cell 203 to the WL3 bias generator 248 to be pulled above Vdd/2, which causes the WL3 bias generator to adjust the voltage applied to WL3 294 accordingly to achieve bipolar gain control.

In another implementation, the memory cell 204 is part of an array, is initially written with a data "one" and is either modified or biased so it will fail data "one" before other cells in the rest of the array fail. In one instance, the leakage of pass device 261 (e.g., similar to pass device 260 in FIG. 2A) is reduced. In another instance, the reference voltage (Vref) applied to the cell 204 is reduced to a smaller value than other cells in the memory array. In each of these instances, the memory cell 204 is adapted to fail data "one" before the cells in the rest of the array fail. The memory cell 204 is read (e.g., using a sense amplifier and/or other circuitry) after some period of time (T1). If the cell 204 has turned on it causes the signal from the cell 204 to the WL3 bias generator to be pulled below Vdd/2, which causes the voltage applied to the second control port 296 to be adjusted accordingly to achieve bipolar gain control.

Figure 2D:
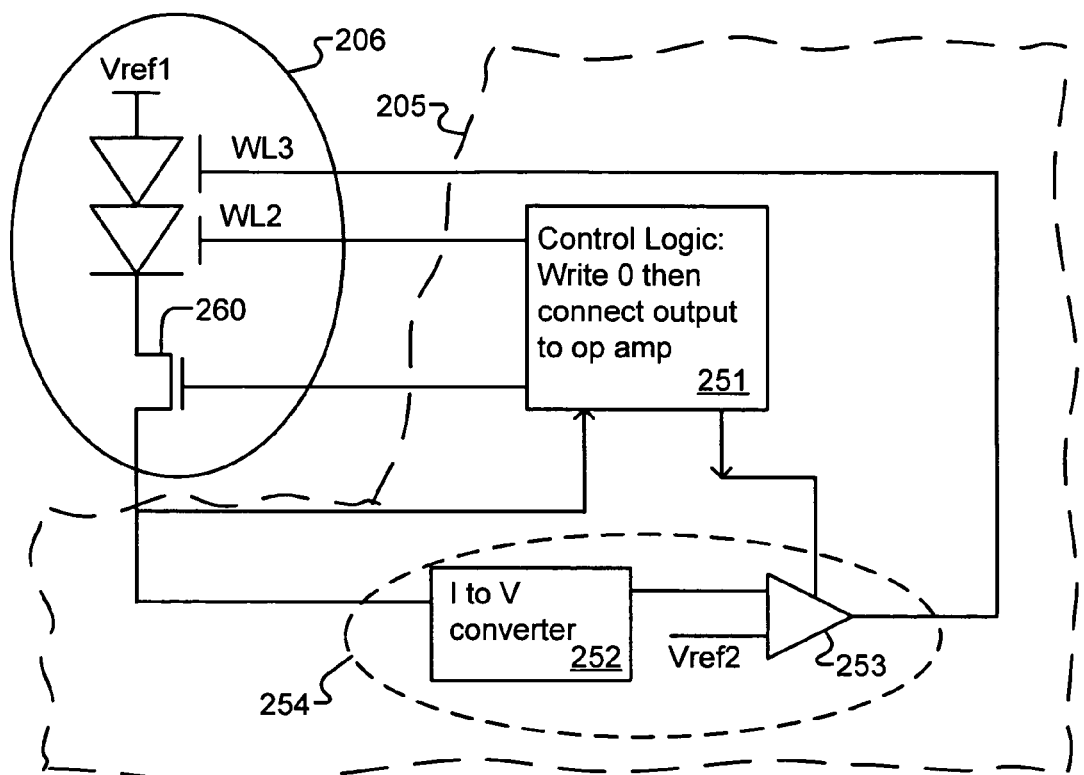
FIG. 2D is another control circuit adapted for providing a temperature-related signal to a thyristor control port for selectively controlling bipolar gains, according to another example embodiment of the present invention.

FIG. 2D shows another circuit arrangement 205 including control logic circuit 251 and a WL3 bias generator circuit 254 arranged for controlling the temperature response of a memory cell 206, according to another example embodiment of the present invention. Memory cell 206 is similar to cells 203 and 204, as well as the thyristor (110) and pass device (260) portions of the circuit 200 shown in FIGS. 2A and 2B; accordingly, reference numerals to certain similar elements and discussion thereof are omitted for brevity. In this embodiment, control logic circuit 251 writes a "zero" into the cell 206 and subsequently connects the output of the cell (with pass device 260 on) to a bias generator circuit 254. The bias generator 254 includes a circuit 252 that converts current from the cell 206 to a voltage and sends the voltage to an op amp 253, which varies the signal applied to WL3 to match a reference voltage. With this approach, the level of WL3 is varied as the off current state (Ioff) of the cell 206 varies with temperature. In this regard (and in one implementation), Ioff is used as a predictor of Vfb, using the correlation between Ioff and Vfb. For example, as Ioff increases, the bias generator 254 applies a voltage to WL3 to move $V_{FB}$ in a direction that compensates for the increased Ioff (e.g., maintains Ioff at a relatively stable level). In another implementation, the control logic 251 is adapted to control the op amp 253 to force WL3 to a set voltage while data is written to the cell 206 (e.g., as discussed above in connection with FIG. 2B and the above-referenced patent to Nemati et al.).

Figure 2E:
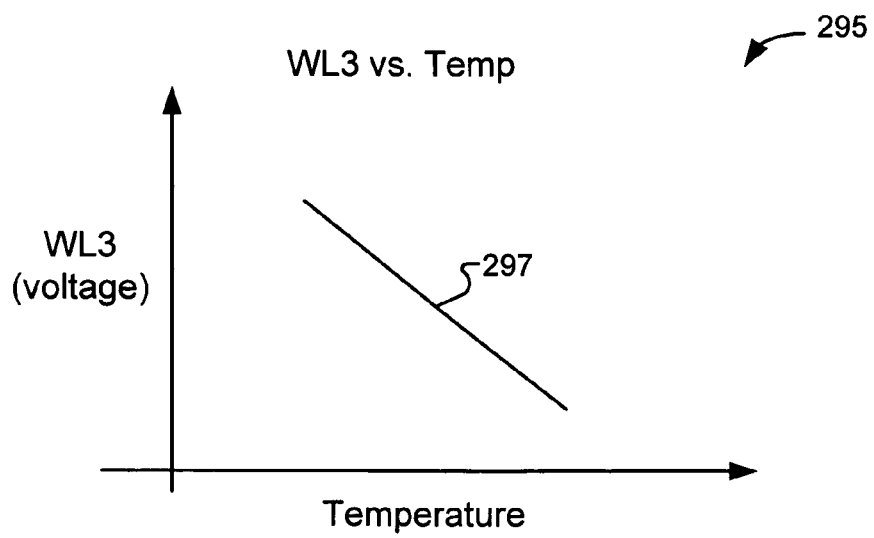
FIG. 2E shows temperature versus voltage as applied to a control port for implementation in connection with controlling bipolar gains, according to another example embodiment of the present invention.

FIG. 2E shows a graph 295 with voltage to be applied to a second control port (e.g., control port 124 of FIG. 2B via WL3 225) on the vertical axis and corresponding temperature on the horizontal axis, according to another example embodiment of the present invention. A voltage is produced in response to temperature as shown by plot 297, with the voltage being applied to a second thyristor control port (e.g., 124 of FIG. 2A) using a circuit, for example, such as those shown in the figures and described in connection with other examples herein. As shown, the applied voltage decreases with increasing temperature and is applicable for controlling the holding current in a thyristor.

In various approaches, the slope of the plot 297 is altered from that shown, and may be implemented using both positive and negative values, depending upon the operational temperature of the device being controlled. In one implementation, the voltage is applied to modulate diode leakage (i.e., the non-ideal component of a thyristor), with the diode leakage being increased as temperature increases and decreased as temperature decreases. In another implementation, the voltage is applied for modulating a base region Gummel number such that the Gummel number is increased with increasing temperature and decreased with decreasing temperature. For this Gummel number modulation, the voltage may be applied to a middle base region without necessarily being applied to an adjacent emitter region (i.e., a control port used to apply the voltage need not overlap an adjacent emitter). In still another implementation, the voltage is applied to reduce bipolar gain as temperature increases to offset corresponding temperature-related increases in bipolar gain. Thus, the slope or curvature of the voltage versus temperature dependence depends upon the mechanism being modulated. In this regard, the following relationships are implemented in connection with various mechanisms, with modulation of these characteristics being related to temperature as indicated:

Ideal (diffusion) is proportional to $\exp(1/T)$
SRH (Shockley-Hall-Read) is proportional to $\exp(\frac{1}{2}T)$
BTB (Band to Band Tunneling) is proportional to T; and
TAT (Trap-Assisted Tunneling) is proportional to $\exp(1/nT)$ where n>2.

Leakage from a particular diode is represented by the sum of all of the above leakage mechanisms (e.g., $I_{off}=I_{ideal}+I_{SRH}+I_{TAT}+I_{BTB}$). The diode $I_{off}$ is controlled with WL3 to achieve selected thyristor characteristics relative to temperature. The shape of the plot 297 shown in FIG. 2D will depend on factors including the type of diode leakage mechanism(s), such as discussed above, that dominates the diode leakage.

In another example embodiment of the present invention, a threshold temperature, or a variety of threshold temperatures, is identified for adjusting voltage applied to a thyristor for controlling bipolar gains therein. For instance, rather than a linearly-adjusted voltage-versus-temperature plot as shown in FIG. 2E, a step-like voltage signal is applied to the thyristor as temperature changes. By performing empirical tests for a particular semiconductor device, operational characteristics for a variety of temperatures can be obtained. By observing temperature-related effects, threshold temperatures for adjusting the voltage applied for controlling bipolar gains can be selected. These threshold temperatures can be programmed into a controller and implemented for adjusting the voltage applied to a thyristor for bipolar gain control.

Figure 3:
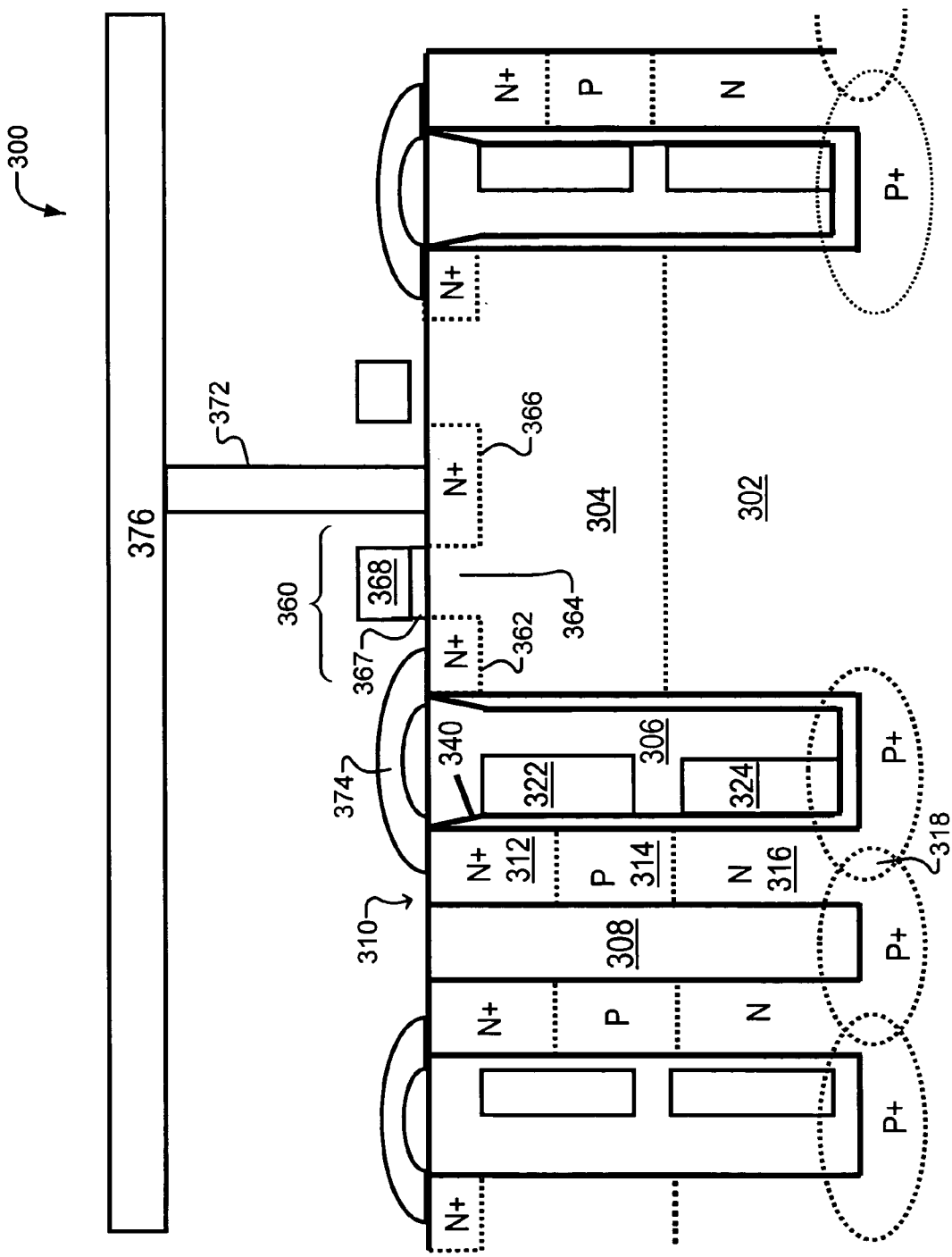
FIG. 3 is a cross-section of a thyristor-based memory cell having a thyristor with a vertical thyristor body and a second control port adapted to manage holding current and forward blocking voltage for the thyristor with temperature, according to another example embodiment of the present invention.

FIG. 3 is cross-sectional view of another circuit arrangement 300 adapted for stable operation at a variety of temperatures using bipolar gain control, according to another example embodiment of the present invention. The device 300 includes a thyristor 310 having vertically-arranged body regions including N+ emitter region 312, P base region 314, N base region 316 and P+ emitter region 318 doped in an N well substrate region 302. A thyristor control port 322 is adapted for capacitively coupling to the thyristor body via dielectric material 340 for enhancing the switching speed of the thyristor between current passing and current blocking states. In this example, the control port 322 is located in a trench 308 that is adjacent to and at least partially around the vertically-arranged thyristor body regions. The trench 308 further includes a second control port 324 adapted for controlling bipolar gains in the thyristor in a manner similar to that discussed above. The remaining portion 306 of the trench 308 is filled with an insulative material (e.g., oxide). In one implementation, the trench 308 is used for doping the P+ emitter region 318.

A pass device 360 includes N+ source/drain regions 362 and 366 in a P well region 304 and separated by a channel region 364, over which a gate dielectric material 367 and a gate 368 are disposed. The pass device 360 is coupled in series to the N+ emitter region 312 via a local interconnect 374, and further to bit line 376 at the N+ source/drain region 366 via bit line contact 373. The P+ emitter region 318 is coupled to a reference voltage line (e.g., using a shunt extending into the substrate 304 and 302 at another cross-section of the circuit arrangement 300, not shown). The gate 368 is adapted for controlling current flow in the pass device 360 and between the N+ emitter region 312 and a bit line 376 coupled to the N+ source/drain region 366. In response to signals applied to the control ports 322 and 324, gate 368 and the bit line 376, the device 300 is adapted for reading from, writing to and storage at the N+ emitter region 362.

In another example embodiment of the present invention, the doping profile of a thyristor base region (e.g., region 116 of FIG. 2A) is altered to decrease the non-ideal component of emitter current in the thyristor, thereby decreasing current leakage between the base region and an adjacent emitter region. The decreased leakage reduces Ihold (e.g., allows the thyristor to maintain its state with design holding current at relatively low temperatures). In one implementation, a dopant of the same conductivity type as the underlying base region is implanted near a surface of the base region that faces a control port adapted for controlling bipolar gains in the thyristor. In one implementation, the implanted base region is fully depleted for low temperature operation, thus reducing the leakage currents and correspondingly decreasing $V_{FB}$ and $I_H$.

Figure 4:
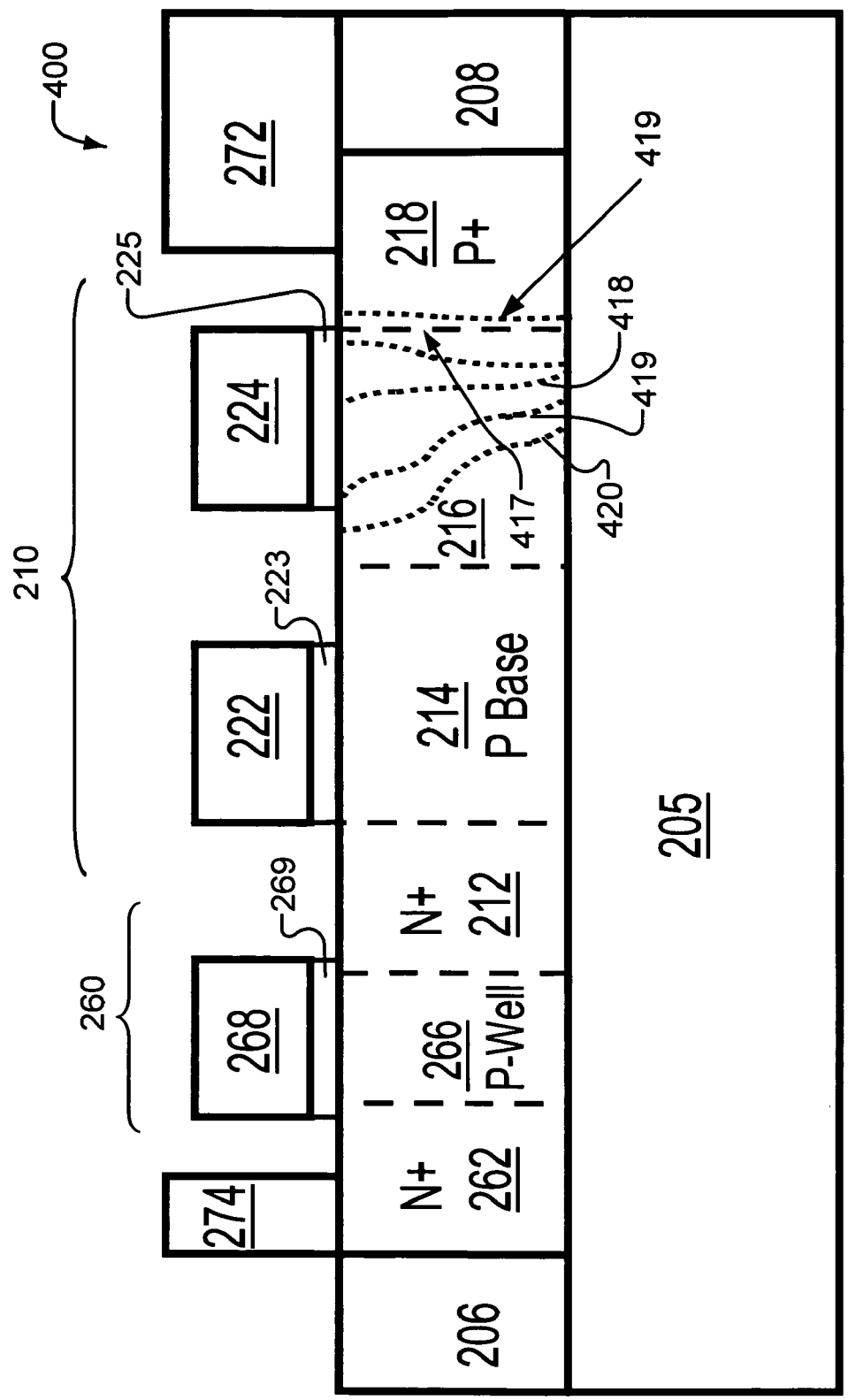
FIG. 4 is a cross-section of the thyristor-based memory cell in FIG. 2A and showing depletion layer widths in a base region below the second control port, according to another example embodiment of the present invention.
Figure 5:
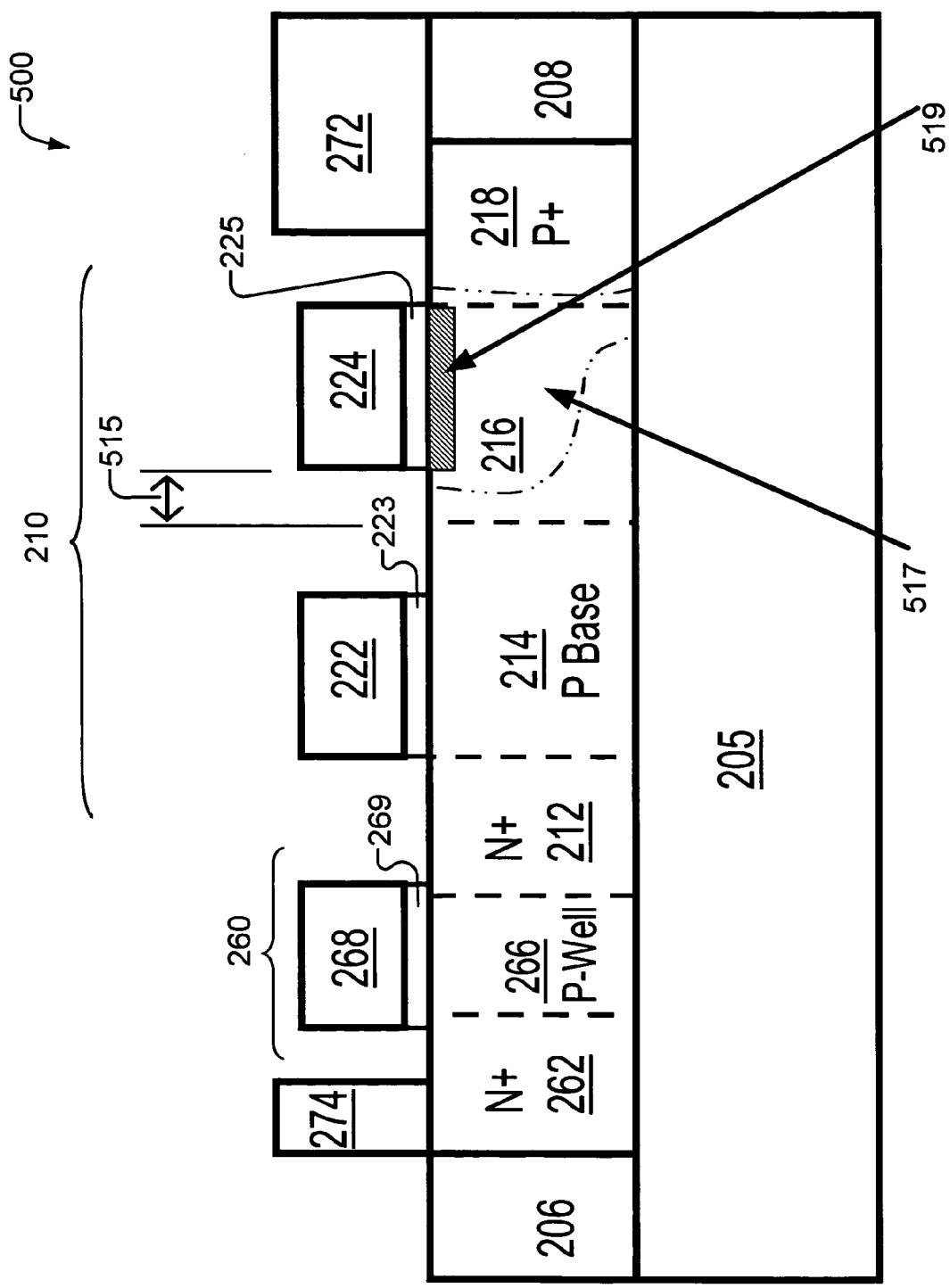
FIG. 5 is a cross-section of the thyristor-based memory cell in FIG. 2A and showing inversion and clear reduction in effective width of a base region below the second control port, according to another example embodiment of the present invention.

FIGS. 4 and 5 show semiconductor devices 400 and 500, similar to the device 200 shown in FIG. 2A and being operated to control holding current ($I_H$) and forward blocking voltage ($V_{FB}$) as a function of temperature in connection with another example embodiments of the present invention. In FIG. 4, a near-zero or negative voltage is applied to the control port 224 to reduce the concentration of carriers near the control port 224 in the N base region 216. The carrier depletion region 417 expands (with broken lines on opposite sides thereof), effectively reducing the width of the N base region 216. As a larger negative voltage is applied to the control port 224, the boundary of the depletion region nearer the P base region 214 extends and forms an increasingly larger depletion region under the control port. Three such implementations with increasingly negative voltage being applied to the control port 224 are shown by broken lines 418-420.

In FIG. 5, an inversion channel 519 is formed in the N base region 216 in response to a sufficiently negative voltage being applied to the control port 224. The voltage applied to the control port 224 also forms a depletion region 517, having a relatively wide area in the N base region 216 due to the relatively large negative voltage being applied. The dimension 515 approximates the corresponding width of the N base region. As discussed above in connection with FIG. 4, the effective width of the N base region 216 is decreased, which tends to decrease $I_H$.

In the example embodiments discussed above in connection with FIGS. 4 and 5, the voltage applied to the control port 224 to achieve the various depletion regions, P-base widths and inversion layers is selected for the particular implementation to which it is applied. For instance, the dopant type and concentration in the N base region 216 affect characteristics including the size of the depletion region. In this regard, the voltage applied thereto is selected to achieve a desired depletion region and/or inversion layer for the dopant type and characteristics of the N base region 216. As these and other characteristics are varied, the voltage is selectively altered to achieve temperature control.

Figure 6:
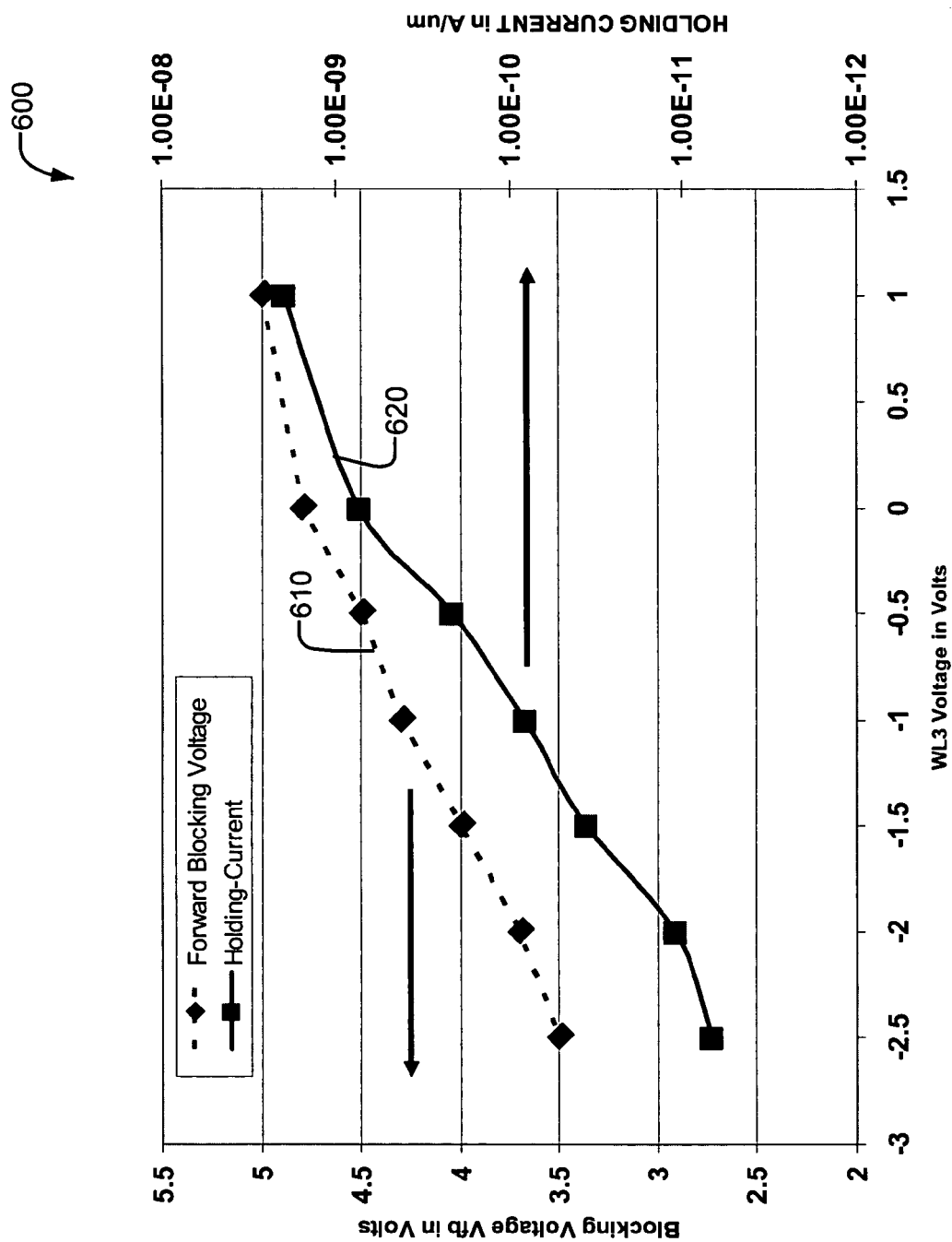
FIG. 6 is a diagram showing holding current ($I_H$) and forward blocking voltage modulation in a thyristor with a second control port, according to another example embodiment of the present invention.

FIG. 6 shows an example approach for modulation of $I_H$ and $V_{FB}$ using a voltage applied to a control port, according to another example embodiment of the present invention. The modulation may, for example, be implemented in connection with one or more of the figures. Blocking voltage ($V_{FB}$) is shown on the left vertical axis and holding current ($I_H$) is shown on the right vertical axis, with the voltage applied to WL3 on the horizontal axis. Referring to FIG. 2A by way of example, the voltage shown on the horizontal axis is applied to the control port 224. As shown, both $I_H$ (plot 620) and $V_{FB}$ (plot 610) can be controlled with the application of a voltage signal to WL3, with $I_H$ decreasing as more negative voltage is applied, as discussed above in connection with FIGS. 4 and 5.

Figure 7:
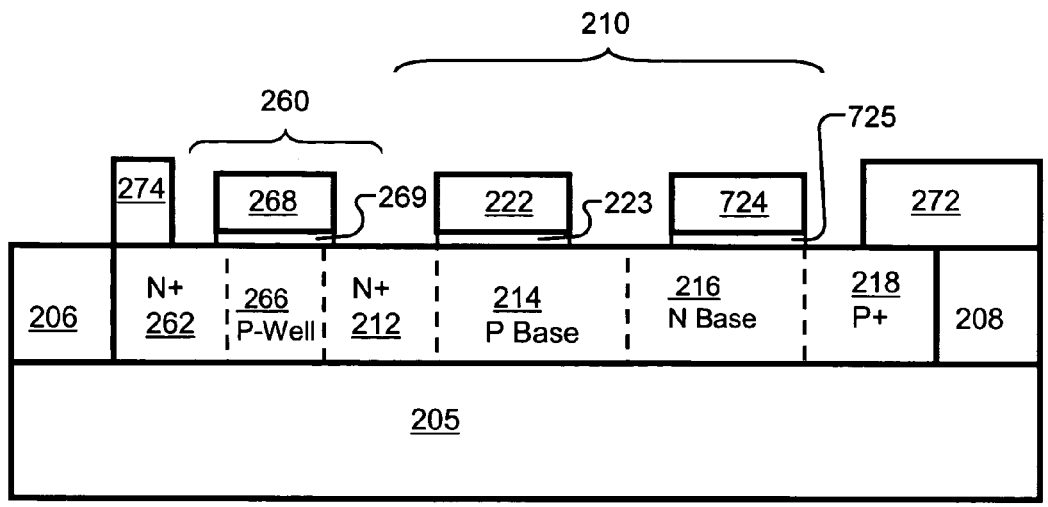
FIG. 7 is a cross-section of a thyristor-based memory cell, similar to the memory cell in FIG. 2A and having the second control port overlapping an adjacent emitter region, according to another example embodiment of the present invention.
Figure 8:
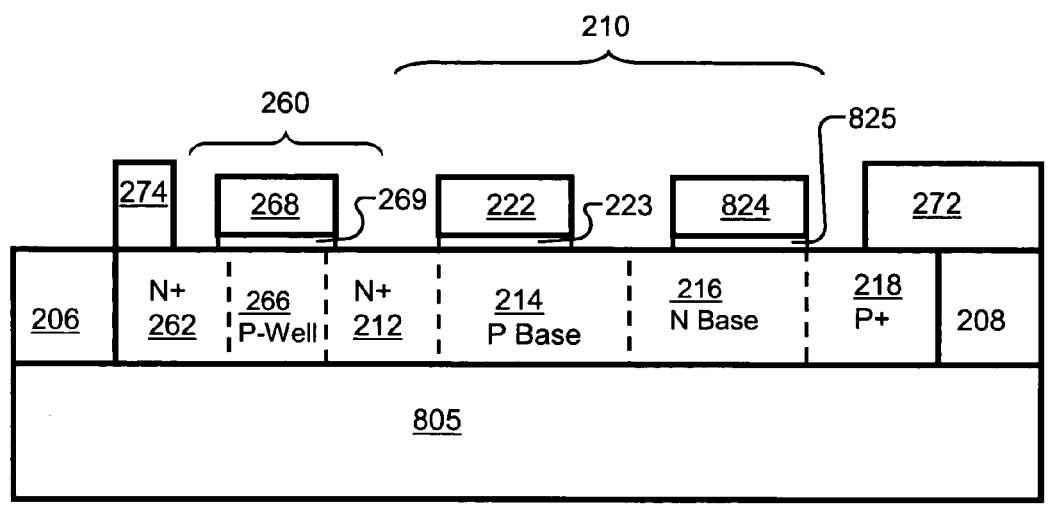
FIG. 8 is a cross-section of a thyristor-based memory cell, similar to the memory cell in FIG. 2A and having the second control port overlapping an adjacent base region, according to another example embodiment of the present invention.
Figure 9:
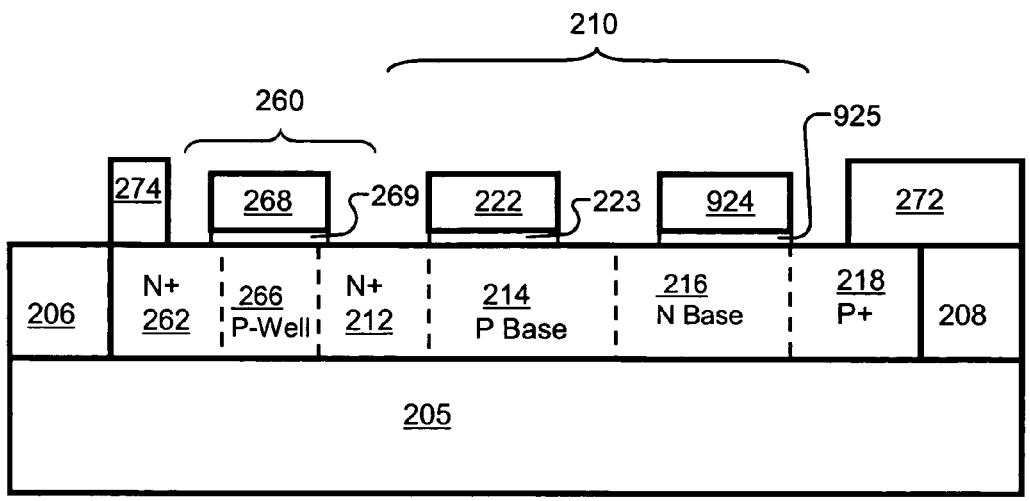
FIG. 9 is a cross-section of a thyristor-based memory cell, similar to the memory cell in FIG. 2A and having the second control port being recessed, relative to adjacent emitter and base regions, according to another example embodiment of the present invention.

FIGS. 7-9 show additional example implementations of the device 200 shown in FIG. 2A, with the location of the control port 224 over the N base region as shown in FIG. 2A being altered. Referring to FIG. 7, control port 724 and dielectric 725 overlap both the N base 216 and the P+ emitter region 218. FIG. 8 shows control port 824 and dielectric 825 overlapping both the N base 216 and the P base 214. FIG. 9 shows the control port 924 and dielectric 925 over the N base 216 but underlapping both the P base 214 and the P+ emitter 218. In each of these approaches, $I_H$ is reduced by application of a voltage to the respective control ports 724, 824 and 924. In connection with the specific approach shown in FIG. 7, it has been discovered that negative voltages applied to the control port 724 deplete the N base region 216 and also accumulate the P emitter 218. This accumulation of the P emitter 218, in addition to the depletion of the N base 216, correspondingly further reduces the Gummel number in the N base region and increases the Gummel number of the P emitter region, which reduces $I_H$.

In another example embodiment of the present invention, the doping profile of a thyristor base region is altered to increase the non-ideal component of emitter current in the thyristor, thereby increasing band-to-band tunneling between the base region and an adjacent emitter region. A second control port is adapted to modulate the electric field and/or the depletion region width in a portion of the base to emitter junction in order to adjustably change the band to band tunneling characteristics. The increased band-to-band tunneling increases temperature stability (e.g., allows the thyristor to maintain its blocking state at relatively high temperatures), such that the $V_{FB}$ margin at high temperatures is greater than the normal operating voltage of the thyristor ($V_{ref}$ relative to ground). In one implementation with a thyristor used in a memory cell in deep submicron processes, a $V_{FB}$ of greater than about 2V at maximum operating conditions is used. In a more particular implementation, $V_{FB}$ is maintained to be relatively stable over a temperature range of between about 0° C. and 125° C. In another implementation, a dopant of the same conductivity type as the underlying base region is implanted near a surface of the base region that faces a gate adapted for reducing bipolar gains in the thyristor. The dopant level can be selected to achieve a variety of bipolar gain conditions, and in one instance the base region is implanted such that it is fully depleted for low temperature operation, thus reducing the tunneling currents and correspondingly decreasing $V_{FB}$ and $I_H$.

Figure 10:
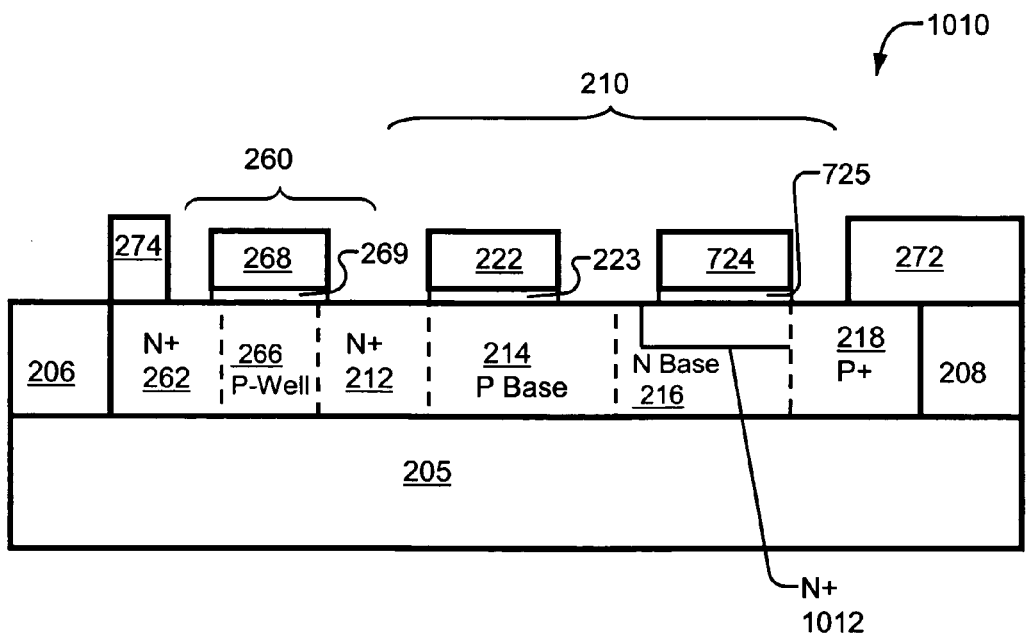
FIG. 10 is a cross-sectional view of a thyristor-based memory cell having a base region doped to enhance band-to-band tunneling and a second control port adapted to manage the band to band tunneling characteristics with temperature, according to another example embodiment of the present invention.

FIG. 10 shows a semiconductor device 1010, similar to the device shown in FIG. 7, and having a dopant introduced thereto for increasing tunneling currents as discussed above, according to another example embodiment of the present invention. Specifically, N+ doped region 1012 is respectively formed in N base region 216 and enhance band-to-band tunneling in the thyristors 210. An adjustable voltage level is applied to control port 724 to change the band to band tunneling current between emitter region 218 and N+ doped region 1012 so that VFB and IH of the thyristor can be adjusted to the desired level as a function of temperature.

In another example embodiment of the present invention, traps and/or defects are locally introduced in a depletion region between a base region and a nearby emitter junction of a thyristor to increase trap-assisted tunneling in the base region. An adjacent gate is then used to control the depletion region width at the J1 junction and thus control the amount of trap-assisted tunneling current in the thyristor. This approach is also useful for achieving a high $V_{FB}$ at high temperature and a low $I_H$ at relatively low temperature (e.g., by using the gate to reduce the width of the depletion region at relatively high temperatures and to widen the depletion region at low temperatures).

Figure 11:
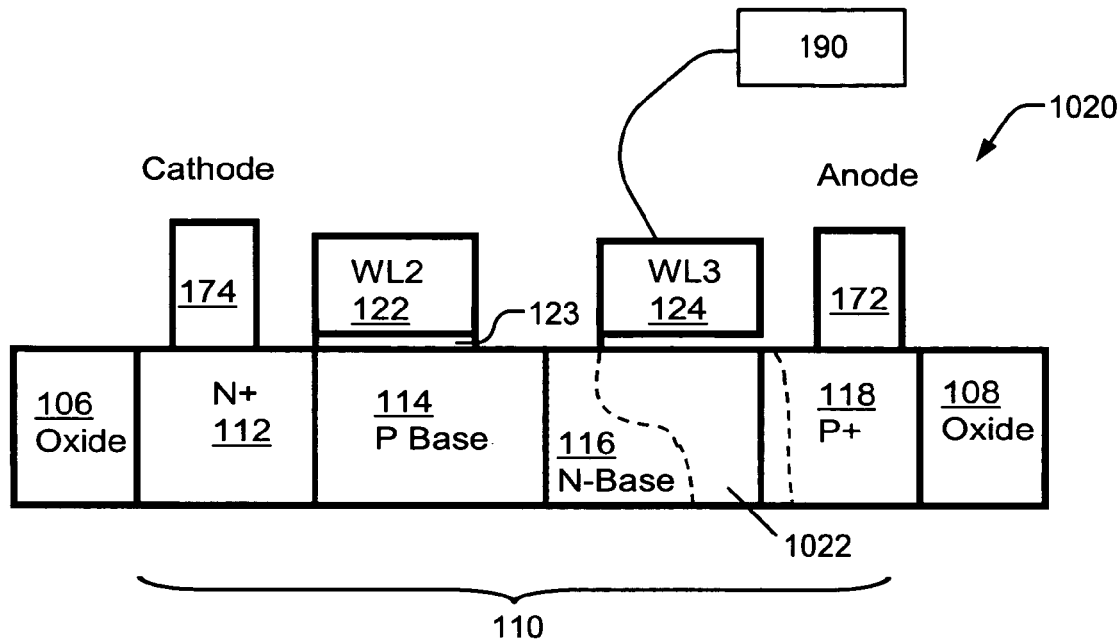
FIG. 11 is a cross-sectional view of a thyristor-based memory cell having a second control port adapted to increase the depletion region width of a base region to reduce the band to band tunneling current characteristics in base emitter junction of the thyristor, according to an example embodiment of the present invention.
Figure 12:
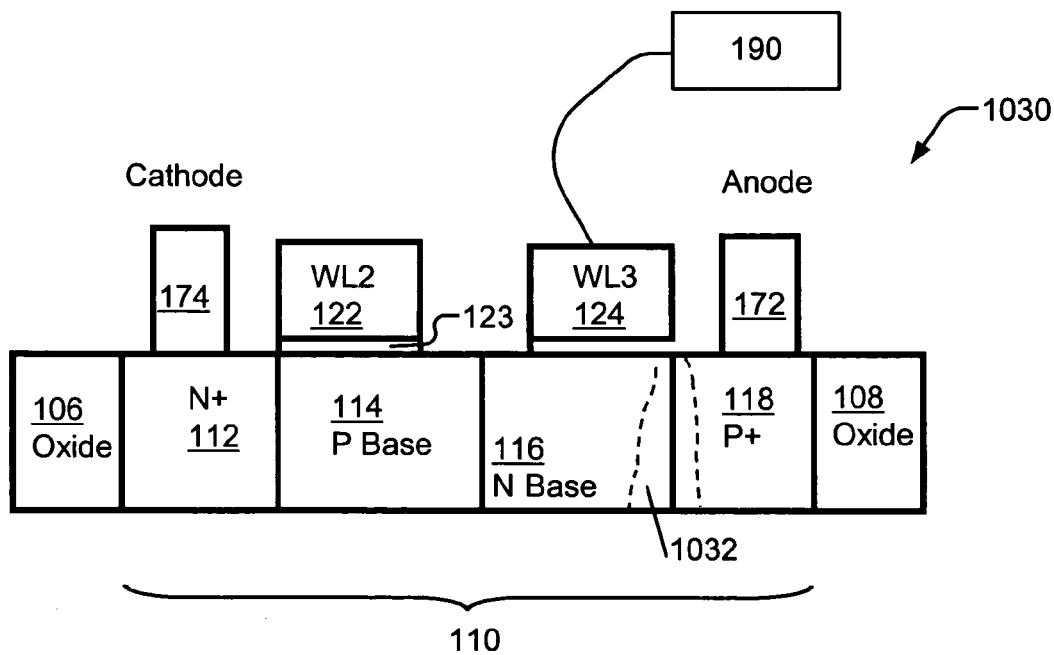
FIG. 12 is a cross-sectional view of a thyristor-based memory cell having a second control port adapted to decrease the depletion region width of a base region to increase the band to band tunneling current characteristics in a base emitter junction of the thyristor, according to another example embodiment of the present invention. While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

FIGS. 11 and 12 show semiconductor devices 1020 and 1030, similar to the device 100 shown in FIG. 1A but having locally introduced traps and/or defects therein, according to another example implementation of the present invention. Trap and/or defect-containing depletion regions are biased with a gate for temperature compensation. Specifically, depletion regions 1022 and 1032 respectively show wide and narrow depletion in the N base region 116 and P+ emitter region 118. With the approach shown in FIG. 11, the relatively wide depletion region 1022 tends to reduce tunneling current in the N base region 116, which is particularly useful during relatively low temperature operation for mitigating increases in holding current. With the approach shown in FIG. 12, the relatively narrow depletion region 1032 tends to increase band-to-band tunneling current in the N base region 116, which is particularly useful during relatively high temperature operation. Moreover, by using the approaches shown in FIGS. 11 and 12 with a single thyristor device, the respective depletion regions can be manipulated at low (FIG. 11) and high (FIG. 12) temperature operation, thereby achieving a high $V_{FB}$ at high temperatures and low $I_H$ at low temperatures.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes may include, but are not necessarily limited to: altering the shapes, locations, and sizes of the illustrated thyristors; adding structures to the integrated circuit device; increasing the number of PN body sections in the thyristor; and interchanging P and N regions, interchanging PNP and NPN bipolar devices, and/or interchanging PMOSFETS with NMOSFETS. In addition, for more information regarding implementations to which the present invention is applicable and their respective operations, reference may be made to U.S. Pat. No. 6,229,161, discussed above, which is fully incorporated herein by reference. Such modifications and changes do not depart from the true spirit and scope of the present invention that is set forth in the following claims.

What is claimed is:

1. A semiconductor device comprising:
a thyristor having thyristor body regions including first and second immediately adjacent base regions between first and second emitter regions;
a first control port configured and arranged to capacitively couple a first signal at least to the first base region;
and a second control port configured and arranged for receiving a second signal generated outside of the thyristor and for coupling the second signal at least to the second base region, the second signal being adapted to control holding current or forward blocking voltage of the thyristor as a function of temperature;
a circuit arrangement electrically coupled to the second control port and configured and arranged to apply the second signal to the second control port;
wherein the circuit arrangement includes a temperature sensing circuit electrically coupled to the thyristor and configured and arranged to apply the second signal to the second control port as a function of the temperature of the thyristor.

2. The semiconductor device of claim 1, wherein the second signal applied by the temperature sensing circuit is adapted to increase bipolar gains of the thyristor when the temperature of the thyristor is below a selected threshold.

3. The semiconductor device of claim 2, wherein the selected threshold is a temperature at which the holding current of the thyristor would exceed a design holding current value.

4. A memory device comprising:
at least one thyristor having thyristor body regions including first and second immediately adjacent base regions respectively coupled to and between first and second emitter regions;
a first control port configured and arranged to capacitively couple a first signal at least to the first base region;
a first circuit configured and arranged to detect a temperature-related failure of the thyristor to maintain its conductance state during a standby mode or to maintain its blocking state;
and a second circuit including a second control port configured and arranged for receiving a second signal generated outside of the thyristor and for coupling the second signal at least to the second base region as a function of the detected failure for controlling holding current or forward blocking voltage of the thyristor;
further comprising a reference thyristor, the first circuit being configured and arranged to detect the failure condition from the reference thyristor.

5. The memory device of claim 4, wherein the reference thyristor is configured and arranged to exhibit temperature-responsive failure prior to the at least one thyristor as the operating temperature of the memory device varies from a design operating temperature thereof.

6. The memory device of claim 5, wherein the reference thyristor is configured and arranged to fail at a lower temperature than the at least one thyristor as the operating temperature increases above the design operating temperature.

7. The memory device of claim 5, wherein the reference thyristor is configured and arranged to fail at a higher temperature than the at least one thyristor as the operating temperature decreases below the design operating temperature.

8. A memory device comprising:
at least one thyristor having thyristor body regions including first and second immediately adjacent base regions respectively coupled to and between first and second emitter regions;
a first control port configured and arranged to capacitively couple a first signal at least to the first base region;
a first circuit configured and arranged to detect a temperature-related failure of the thyristor to maintain its conductance state during a standby mode or to maintain its blocking state;
a second circuit including a second control port configured and arranged for receiving a second signal generated outside of the thyristor and for coupling the second signal at least to the second base region as a function of the detected failure for controlling holding current or forward blocking voltage of the thyristor;
further comprising a plurality of memory cells, each memory cell including a thyristor, wherein the first circuit further comprises:
a first reference memory cell including a thyristor and adapted to store a data "zero" and to fail to retain the data "zero" as a function of the conductance state of the thyristor in the first reference memory cell before other memory cells in the memory device fail data "zero";
a second reference memory cell including a thyristor and adapted to store a data "one" and to fail to retain the data "one" as a function of the conductance state of the thyristor in the second reference memory cell before other memory cells in the memory device fail data "one";
and the second circuit being adapted to apply the second signal to the second control port as a function of at least one of the first and second reference memory cells failing to retain data.

9. The memory device of claim 8, wherein an emitter of the thyristor in the first reference memory cell is coupled to a reference voltage signal that is greater than a reference voltage signal coupled to at least one of the emitter regions of the thyristors in the plurality of memory cells.

10. The memory device of claim 8, wherein an emitter of the thyristor in the first reference memory cell is coupled to a reference voltage signal that is less than a reference voltage signal coupled to at least one of the emitter regions of the thyristors in the plurality of memory cells.

11. The memory device of claim 8, wherein each memory cell includes a pass device coupled to an emitter region of the respective thyristor, each pass device exhibiting leakage, the pass device in the second reference thyristor memory cell being adapted to leak relatively more current than the pass devices in the plurality of memory cells such that the second reference memory cell fails to retain data before the plurality of memory cells fail to retain data.

12. A memory device comprising:
at least one thyristor having thyristor body regions including first and second immediately adjacent base regions respectively coupled to and between first and second emitter regions;
a first control port configured and arranged to capacitively couple a first signal at least to the first base region;
a first circuit configured and arranged to detect a temperature-related failure of the thyristor to maintain its conductance state during a standby mode or to maintain its blocking state;
and a second circuit including a second control port configured and arranged for receiving a second signal generated outside of the thyristor and for coupling the second signal at least to the second base region as a function of the detected failure for controlling holding current or forward blocking voltage of the thyristor;
wherein the second control port extends over a junction between the second base region and the second emitter region.

13. The memory device of claim 12, wherein the second circuit is adapted to capacitively couple the second signal to the second emitter region for accumulating carriers therein.

14. A memory device comprising:
at least one thyristor having thyristor body regions including first and second immediately adjacent base regions respectively coupled to and between first and second emitter regions;
a first control port configured and arranged to capacitively couple a first signal at least to the first base region;
a first circuit configured and arranged to detect a temperature-related failure of the thyristor to maintain its conductance state during a standby mode or to maintain its blocking state;
and a second circuit including a second control port configured and arranged for receiving a second signal generated outside of the thyristor and for coupling the second signal at least to the second base region as a function of the detected failure for controlling holding current or forward blocking voltage of the thyristor;
wherein the second control port extends over a junction between the first and second base regions.

15. A semiconductor device comprising:
a thyristor having thyristor body regions including first and second immediately adjacent base regions between first and second emitter regions;
a first control port configured and arranged to capacitively couple a first signal at least to the first base region; and
a second control port configured and arranged for receiving a second signal generated outside of the thyristor and for coupling the second signal at least to the second base region, the second signal being adapted to control holding current or forward blocking voltage of the thyristor as a function of temperature;
wherein one of the base regions includes N-doped material having a higher concentration of N+ dopant in a depletion region that faces the second control port.

16. A memory device comprising:
at least one thyristor having thyristor body regions including first and second immediately adjacent base regions respectively coupled to and between first and second emitter regions;
a first control port configured and arranged to capacitively couple a first signal at least to the first base region;
a first circuit configured and arranged to detect a temperature-related failure of the thyristor to maintain its conductance state during a standby mode or to maintain its blocking state; and
a second circuit including a second control port configured and arranged for receiving a second signal generated outside of the thyristor and for coupling the second signal at least to the second base region as a function of the detected failure for controlling holding current or forward blocking voltage of the thyristor;
wherein one of the base regions includes N-doped material having a higher concentration of N+ dopant in a depletion region that faces the second control port.

17. A semiconductor device comprising:
a thyristor having thyristor body regions including first and second immediately adjacent base regions between first and second emitter regions, the thyristor body being maintained in a conductance state as a function of holding current; and
a control circuit configured and a ranged for applying a signal to at least one of the base regions for controlling the holding current or forward blocking voltage as a function of temperature, the signal being generated outside of the thyristor;
further comprising a second control port,
wherein one of the base regions includes N-doped material having a higher concentration of N+ dopant in a depletion region that faces the second control port.

* * * * *